(12) United States Patent
Kimura

(10) Patent No.: US 8,053,803 B2
(45) Date of Patent: Nov. 8, 2011

(54) PACKAGE FOR OPTICAL SEMICONDUCTOR ELEMENT

(75) Inventor: Yasuyuki Kimura, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 26 days.

(21) Appl. No.: 12/408,887

(22) Filed: Mar. 23, 2009

(65) Prior Publication Data

US 2009/0242926 A1 Oct. 1, 2009

(30) Foreign Application Priority Data

Mar. 27, 2008 (JP) .................... P2008-084837

(51) Int. Cl.
*H01L 33/00* (2010.01)
(52) U.S. Cl. ............... 257/99; 257/E23.192; 257/781
(58) Field of Classification Search ........... 257/79, 257/81, 98, 100, 99, E23.192, E31.117, E33.058, 257/780, 781, 784
See application file for complete search history.

(56) References Cited

U.S. PATENT DOCUMENTS

| 4,951,011 | A | 8/1990 | Heckaman et al. |
| 6,074,102 | A | 6/2000 | Oikawa |
| 2003/0020149 | A1 | 1/2003 | Ogura et al. |
| 2004/0138045 | A1* | 7/2004 | Komatsudani et al. ......... 501/79 |

FOREIGN PATENT DOCUMENTS

| JP | 2007053252 | * | 1/2007 |
| JP | 2007-220843 | | 8/2007 |

* cited by examiner

*Primary Examiner* — Hoa B Trinh
(74) *Attorney, Agent, or Firm* — Drinker Biddle & Reath LLP

(57) ABSTRACT

A package for an optical semiconductor element is provided. The package includes: a stem body having a sealing hole therein; and a lead pin having a glass sealing portion which is sealed with sealing glass in the sealing hole. Characteristic impedance of the glass sealing portion is adjusted to a given value. The characteristic impedance Zo is given by: $Zo=(138/Er^{1/2})\times\log(D/d)$, where a hole diameter of the sealing hole is D, a wire diameter of the lead pint is d, and a dielectric constant of the sealing glass is Er, and the dielectric constant Er of the sealing glass is set by controlling an amount of bubble contained in the sealing glass.

6 Claims, 3 Drawing Sheets

PACKAGE FOR OPTICAL SEMICONDUCTOR ELEMENT

This application claims priority from Japanese Patent Application No. 2008-08 4837, filed on Mar. 27, 2008, the entire contents of which are hereby incorporated by reference.

BACKGROUND OF THE INVENTION

1. Technical Field

The present disclosure relates to a package for an optical semiconductor element and more particularly to a package for an optical semiconductor element having an excellent property in high-speed communication.

2. Related Art

In a communication field, a value of characteristic impedance of a signal wire is unified as 50Ω. As for a package for an optical semiconductor element used for optical communication, it was not necessary to pay attention to matching of the characteristic impedance in the past. However, in high-speed communication at 8 Gbps, for example, a problem occurs in that signal transmission efficiency deteriorates if the value of the characteristic impedance deviates from 50Ω. Therefore, the characteristic impedance is required to be matched.

A signal wire (lead pin) used for the package for the optical semiconductor element is attached to a stem body by glass-sealing and the signal wire becomes a pseudo-coaxial structure. The present invention relates to a technique capable of matching the characteristic impedance in a portion where the lead pin is sealed.

Characteristic impedance Zo of a signal lead pin is given by the following expression:

$$Zo = (138/Er^{1/2}) \times \log(D/d),$$

where Er is a dielectric constant of glass used for sealing the lead pin, D is a hole diameter of a sealing hole for mounting the lead pin, and d is a wire diameter of the lead pint.

The shape, size, and the like of the packet for the optical semiconductor element are various. In a general package for an optical semiconductor element (for example, TO-46 type) used for optical communication, the dielectric constant Er is 5.0, the sealing hole of the lead pin is 1.2 mm, the wire diameter of the lead pin is 0.45 mm, and the value of the characteristic impedance is 25Ω. Accordingly, in the package for the optical semiconductor element in which the value of the characteristic impedance deviates from 50Ω, it is necessary to correct the value of the characteristic impedance to 50Ω in order to improve a signal transmission property (see e.g., JP-A-2007-220843).

Also, as a method of enabling the value of the characteristic impedance of the package for the optical semiconductor element to be close to 50Ω, a method of increasing the hole diameter D of the sealing hole of the lead pin, a method of decreasing the wire diameter of the lead pin, and a method of decreasing the dielectric constant Er of sealing glass are taken into consideration.

Among these methods, the method of increasing the hole diameter D of the sealing hole of the lead pin results in reduction in an area where an optical semiconductor element of the step body is arranged due to the increase in the sealing hole. Therefore, the size of the hole diameter D is restrictive due to the specification of the stem body.

In addition, in order to realize the method of decreasing the wire diameter of the lead pin, the wire diameter has to be set in consideration of a wire bonding property, since an end surface of the lead pin is a wire bonding surface.

The method of using glass having a low dielectric constant Er as sealing glass also has a problem in that glass having the low dielectric constant is generally poor in a sealing property and an airtight property is problematic when the lead pin is sealed. In general, when the dielectric constant of glass is decreased, modifier oxide (metal oxide or the like) added to the glass has to be reduced. For that reason, an amount of an additive contributing to the airtight property with the lead pin or the stem body is reduced, and thus the airtight property with the lead pin or the like deteriorates. Moreover, since the additive has a function of adjusting a thermal expansion coefficient of glass, the airtight property may deteriorate in a package (matched type) for an optical semiconductor element in which the thermal expansion coefficient of the glass varies by changing the amount of additive and the thermal expansion coefficient of the glass is matched with the stem body.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any of the problems described above.

Accordingly, it is an aspect of the present invention to provide a package for an optical semiconductor element capable of sealing a lead pin in an airtight manner without deterioration in a sealing property of glass and being appropriately used for high-speed communication.

According to one or more aspects of the present invention, a package for an optical semiconductor element is provided. The package includes: a stem body having a sealing hole therein; and a lead pin having a glass sealing portion which is sealed with sealing glass in the sealing hole. Characteristic impedance of the glass sealing portion is adjusted to a given value. The characteristic impedance Zo is given by: $Zo=(138/Er^{1/2})\times\log(D/d)$, where a hole diameter of the sealing hole is D, a wire diameter of the lead pint is d, and a dielectric constant of the sealing glass is Er, and the dielectric constant Er of the sealing glass is set by controlling an amount of bubble contained in the sealing glass.

According to one or more aspects of the present invention, it is advantageous that the hole diameter D of the sealing hole, the wire diameter d of the lead pin, and the dielectric constant Er of the sealing glass are set such that the characteristic impedance Zo is almost 50Ω.

According to one or more aspects of the present invention, it is advantageous that the hole diameter D of the sealing hole is about 1.2 mm, the wire diameter d of the lead pin is about 0.21 mm, the dielectric constant Er of the sealing glass is about 4.4.

According to the present invention, the dielectric constant of sealing glass is adjusted by controlling an amount of bubble contained in the sealing glass. Therefore, the impedance value Zo of the glass sealing portion can be set to a desirable value. Moreover, the package having an excellent transmission property is provided by setting an impedance value to a desirable value for high-speed communication.

Other aspects and advantages of the present invention will be apparent from the following description, the drawings, and the claims.

DETAILED DESCRIPTION OF EXEMPLARY
EMBODIMENTS OF THE INVENTION

Exemplary embodiments of the present invention will be now described with reference to the drawings hereinafter.

Figure 1:
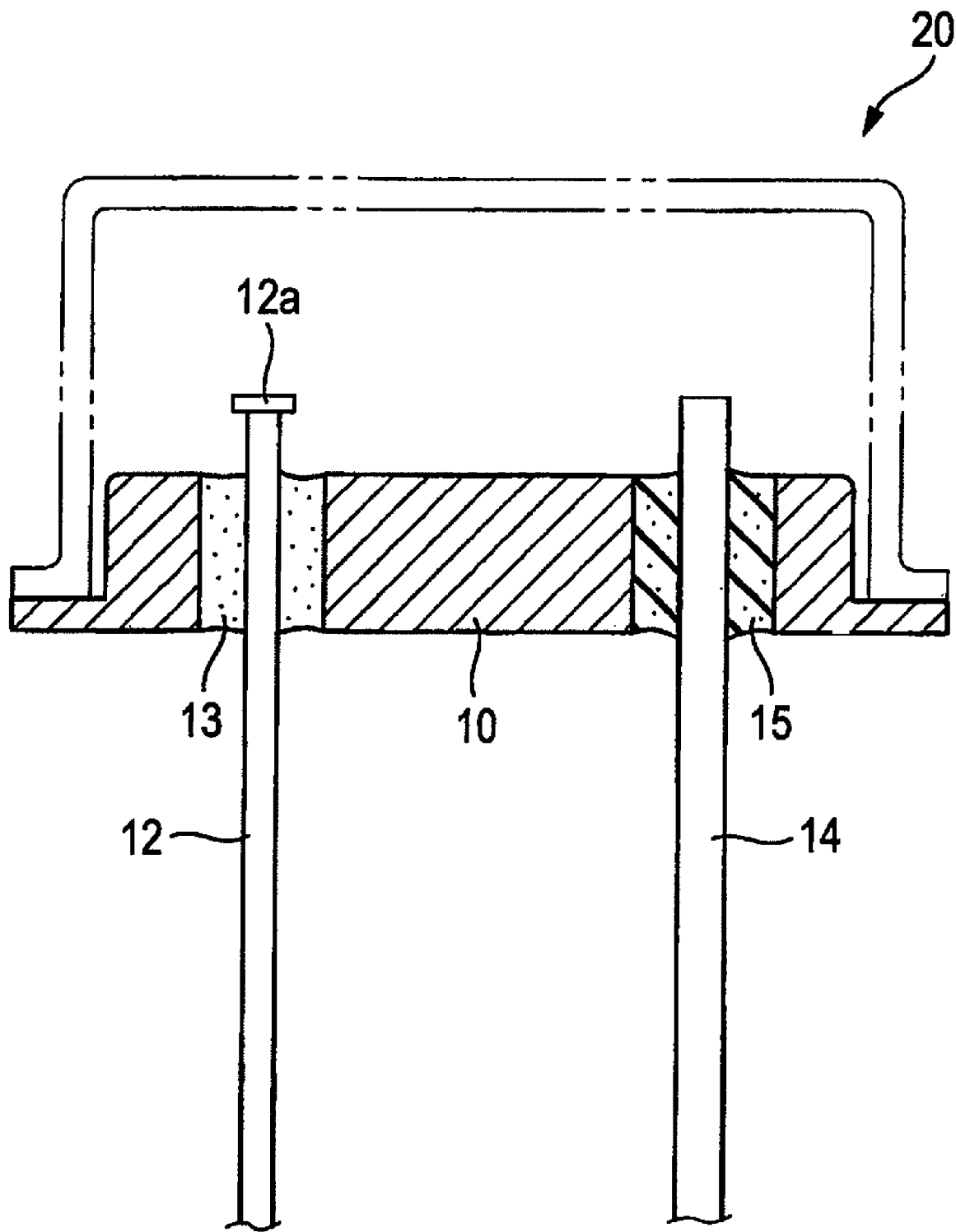
FIG. 1 is a cross-sectional view illustrating the configuration of a package for an optical semiconductor element according to an exemplary embodiment of the invention.

FIG. 1 is a cross-sectional view illustrating the configuration of the package for the optical semiconductor element according to an exemplary embodiment of the present invention. In a package 20 for an optical semiconductor element, a signal lead pin 12 is sealed with glass 13 and a power lead pin 14 is sealed with glass 15 so that the signal lead pin 12 and the power lead pin 14 are attached to a stem body 10.

An optical semiconductor device is assembled by mounting an optical semiconductor element on the stem body 10, electrically connecting the optical semiconductor element to the lead pins 12 and 14 by wire bonding, and sealing the stem body 10 with a cap. There are various packages for the optical semiconductor element. The package for the optical semiconductor element 20 shown in FIG. 1 is just an example.

In the package 20 according to the exemplary embodiment, the lead pin 12 used for a signal line has a configuration in which a characteristic impedance is matched to 50Ω. The lead pin 14 used for a power source line is sealed with sealing glass which is generally used.

As a method of matching the characteristic impedance of a glass sealing portion of the lead pin 12 used for a signal line to 50Ω, in the package 20 according to the exemplary embodiment, a method is employed which narrows a wire diameter of the lead pin 12 more than a wire diameter of a known lead pin without changing the diameter of a sealing hole of the lead pin. Furthermore, a method is employed which decreases a dielectric constant more than a known dielectric constant by adjusting an amount of bubble contained in the glass 13 sealing the lead pin 12.

That is, in the related art package, the dielectric constant Er of the sealing glass was 5.0, the sealing hole of the lead pin was 1.2 mm, and the wire diameter of the lead pin was 0.45 mm. On the other hand, in the exemplary embodiment, the sealing hole of the lead pin was about 1.2 mm without change, the wire diameter of the lead pin was changed from 0.45 mm to 0.21 mm, and the dielectric constant of the glass was decreased from 5.0 to 4.4, so that value of the characteristic impedance was set to about 50Ω.

The lead pin 12 can cause a problem in that an area of a wire bonding surface of the lead pin 12 is decreased due to the narrowness of the wire diameter and thus the wire bonding property may deteriorate. However, in this embodiment, the wiring boding area can be ensured by forming the lead pin 12 in a nail lead shape and providing a large diameter portion 12a in the end of the lead pin 12.

Hereinafter, an experimental results, which were carried out using a method of adjusting the dielectric constant of the glass by adjusting the amount of bubble contained in the glass, will be described.

Table 1 shows results obtained by measuring the density of glass samples. The glass samples are prepared by controlling an amount of bubble contained in the glass. In Table 1, Sample (a) is glass in which bubble is rarely contained, Sample (b) is glass in which some bubbles are contained, and Sample (c) of the exemplary embodiment is glass in which much bubbles are contained. In addition, glass used in the experiment is glass which mainly contains $SiO_2$. The glass is sealing glass whose thermal expansion coefficient is matched with that of the stem body, thereby sealing the lead pin. The glass is used for a so-called matched type product. A standard of the sealing glass has a density of 2.28 g/cc and a dielectric constant of 5.0 at 1 MHz.

TABLE 1

| SAMPLE | DENSITY (g/cc) |
|--------|----------------|
| (a)    | 2.251          |
| (b)    | 2.170          |
| (c)    | 2.003          |

The standard of the glass is nearly reflected to Sample (a) in view of the characteristic of each glass shown in Table 1. Sample (b) has the density lower than that of Sample (a) and a bubble content more than that of Sample (a). In Example, Sample (c) shows that the density thereof is lower than that of Sample (b) and the bubble content is more than that of the glass of Sample (b).

In comparison of the appearance of the glass of each sample, the color of the glass becomes white along with an increase in the bubble content. In this way, an amount of bubble contained in the glass can be guessed from the appearance of the glass.

Figure 2:
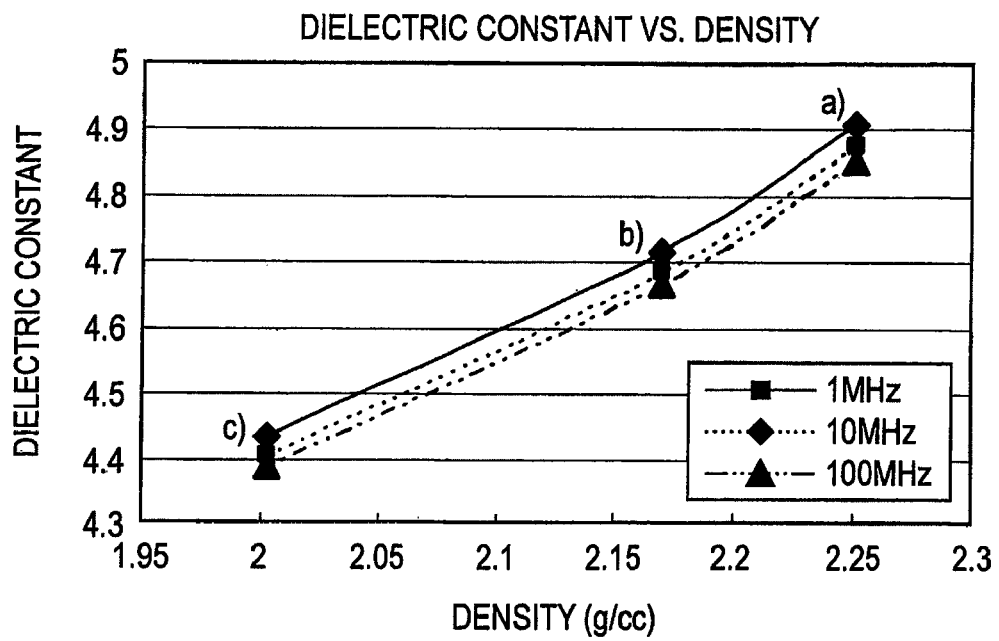
FIG. 2 is a graph showing dielectric constants of glass when an amount of bubble contained in glass varies.

FIG. 2 is a graph illustrating results obtained by measuring the dielectric constant of Samples (a), (b) and (c) at 1 MHz, 10 MHz, and 100 MHz, respectively. Sample (b) has the dielectric constant lower than that of Sample (a) and Sample (c) has the dielectric constant lower than that of Sample (b). The dielectric constant of Sample (c) is about 4.4.

Figure 3:
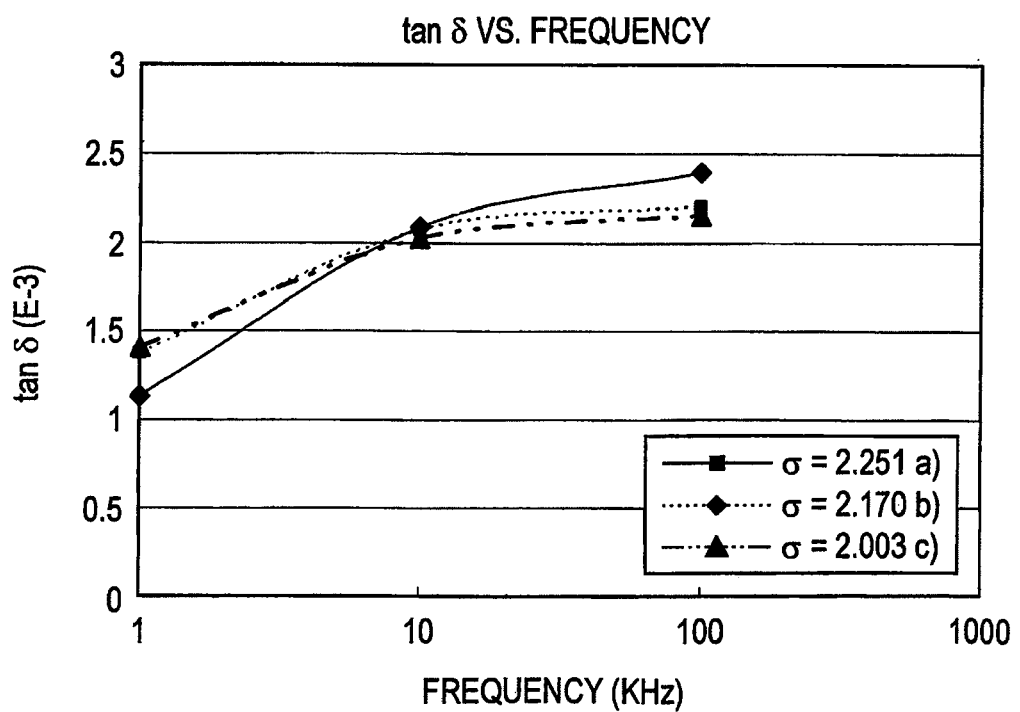
FIG. 3 is a graph illustrating a transmission characteristic when the amount of bubble contained in the glass varies.

FIG. 3 shows results obtained by measuring a tan δ value for a signal delay characteristic at time of signal transmission in Samples (a), (b) and (c). According to the experiment results, a considerable difference in the signal delay characteristic is not present in Samples (a), (b), and (c). That is, in the package for the optical semiconductor element using Sample (c) prepared by increasing an amount of bubble, waveform deformation is not occurred at the time of signal transmission.

Table 2 shows results obtained by carrying out an airtight experiment in such a manner that the lead pin is glass-sealed to the stem body with Sample (c) and additionally the stem body is sealed with a cap.

The experiment was carried out by maintaining, for a certain time, the sample sealed with the cap in a container where pressure is adjusted such that a temperature becomes 121° C. and humidity becomes 100%, and inspecting whether water leaks in the cap. Sample (c) in Table 2 is the same as Sample (c) described above. Sample (d) is a sample sealed with standard glass and Sample (e) is a sample sealed with glass having a low dielectric constant and being available in the market. The number of each sample (d), (e) and (c) is twenty and Table 2 shows the number of samples in which water leaks along with time elapsed.

TABLE 2

| SAMPLE | 0 HOUR | AFTER 70 HOURS | AFTER 140 HOURS | AFTER 210 HOURS | AFTER 280 HOURS |
|--------|--------|----------------|-----------------|-----------------|-----------------|
| (d)    | 0/20   | 0/20           | 0/20            | 0/20            | 0/20            |
| (e)    | 0/20   | 0/20           | 9/20            | 14/20           | 19/20           |
| (c)    | 0/20   | 0/20           | 0/20            | 0/20            | 0/20            |

Condition: 121° C./Humidity of 100%/2 Atmospheric Pressure

According to the result of the airtight experiment shown in Table 2, an airtight property is insufficient in the sample using the glass having the low dielectric constant and being available in the market, but Sample (d) using the standard glass and Sample (c) having the increased amount of bubble according to the embodiment maintain a sufficient airtight property. That is, it can be understood that the airtight property of the package formed using the glass of Sample (c) is also ensured.

In a manufacturing process of the package for the optical semiconductor element according to the exemplary embodiment, glass fine particles of sealing glass are compression-molded to form a cylindrical tablet, the stem body, the glass tablet, and the lead pins are assembled using a carbon jig and inserted into a heating furnace, and then the glass tablet is melted to carry out glass sealing.

In the exemplary embodiment, since the dielectric constant of the sealing glass is made lower than that of a known sealing glass by increasing the amount of bubble contained in the sealing glass, the amount of bubble contained in the glass tablet is adjusted to be increased from the step of forming the glass tablet.

Moreover, even in the glass welding process, the amount of bubble contained in the sealing glass is controlled so as to be increased.

Figure 4:
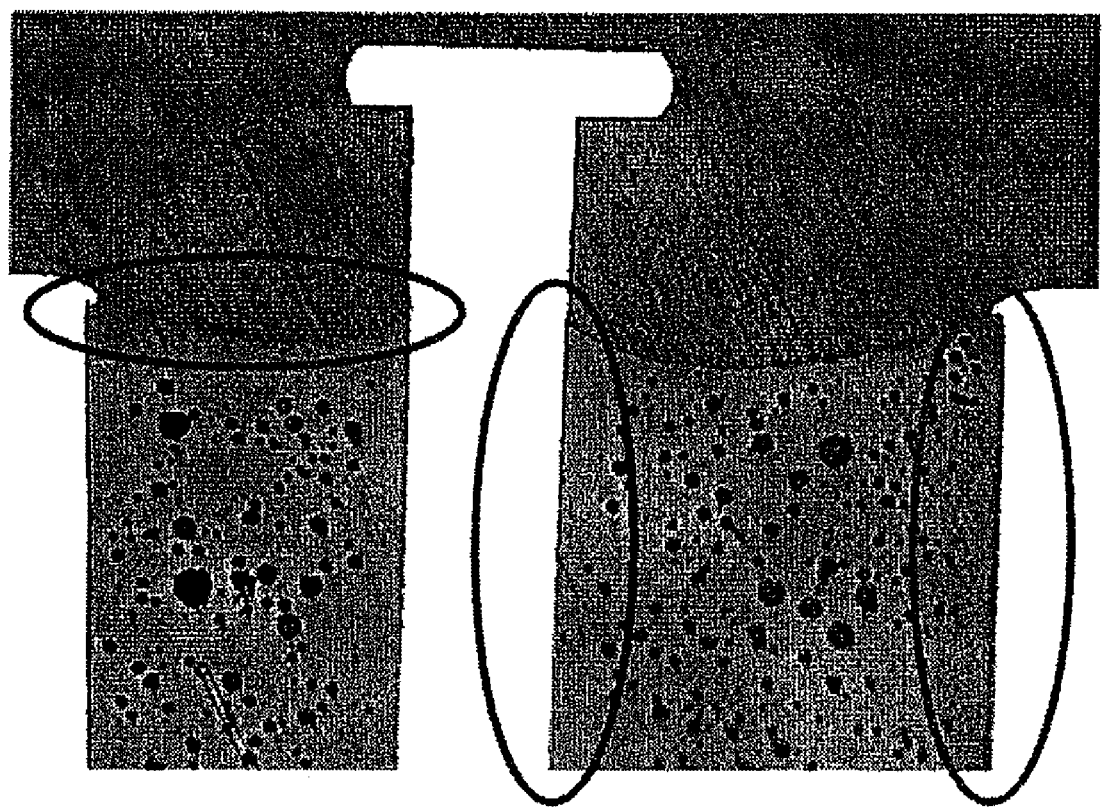
FIG. 4 is a photomicrograph illustrating a portion where lead pins are glass-sealed.

FIG. 4 is a photomicrograph illustrating a portion where the lead pins are glass-sealed with the above-described sealing glass. According to the photomicrograph, the bubble is present inside the glass and the bubble is slightly distributed near the surface of the glass, interfaces between the lead pins and the glass, and an interface between the inside surface of the sealing hole of the stem body and the glass, when the lead pins are glass-sealed with the sealing glass.

The above-described airtight experiment demonstrates that the sufficient airtight property is obtained even when the glass prepared by increasing the amount of bubble is used as the sealing glass. As shown in FIG. 4, it is considered that the fact that the distribution of the bubble near the interfaces between the lead pins and the glass or the interface between the sealing hole and the glass is suppressed supports the experimental result that the sufficient airtight property is obtained even in using the glass containing the increased bubble.

As described above, according to the package for the optical semiconductor element according to the exemplary embodiment, the characteristic impedance of the package for the optical semiconductor element can be set to 50Ω by adjusting an amount of bubble contained in the sealing glass used to seal the lead pins. Moreover, the package for the optical semiconductor element has an excellent property of transmitting a signal at a high speed and has a sufficient airtight property required for a package for an optical semiconductor element.

In the above-described embodiment, although the case in which the characteristic impedance is set to 50Ω has been described, the method of adjusting the amount of bubble contained in the sealing glass to adjust the dielectric constant of the sealing glass is not limited to the case where the characteristic impedance is matched to 50Ω, but may be used in a case where an impedance value is appropriately adjusted.

In the above-described embodiment, the characteristic impedance is matched to 50Ω by setting the diameter D of the sealing hole and the wire diameter d of the lead pins to about 1.2 mm and about 0.21 mm, respectively, and adjusting the dielectric constant Er to about 4.4. However, the diameter D of the sealing hole or the wire diameter d of the lead pins is appropriately set as a designed value depending on a product. The dielectric constant of the sealing glass is appropriately set depending on the diameter of the sealing hole or the wire diameter of the lead pins, and the amount of bubble contained in the sealing glass is adjusted so as to match with the given dielectric constant. Since the dielectric constant of the sealing glass is determined depending on a quality of the sealing glass or an additive, the amount of bubble contained in the sealing glass is also determined in accordance with the sealing glass.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A package for an optical semiconductor element, the package comprising:
   a stem body having a first sealing hole and a second sealing hole therein;
   a first lead pin adapted to be a power lead pin and having a first glass sealing portion which is sealed with a first sealing glass in the first sealing hole; and
   a second lead pin adapted to be a signal lead pin and having a second glass sealing portion which is sealed with a second sealing glass in the second sealing hole,
   wherein characteristic impedance of the second glass sealing portion is adjusted to a given value,
   wherein the characteristic impedance Zo is given by:

$$Zo = (138/Er^{1/2}) \times \log(D/d),$$

where a hole diameter of the second sealing hole is D, a wire diameter of the second lead pin is d, and a dielectric constant of the second sealing glass is Er, and
   wherein the second sealing glass includes bubbles, and the dielectric constant Er of the second sealing glass is set by controlling an amount of the bubbles contained in the second sealing glass, and
   wherein the dielectric constant of the second sealing glass is lower than a dielectric constant of the first sealing glass.

2. The package according to claim 1, wherein the hole diameter D of the second sealing hole, the wire diameter d of the second lead pin, and the dielectric constant Er of the second sealing glass are set such that the characteristic impedance Zo is almost 50 Ω.

3. The package according to claim 2, wherein the hole diameter D of the second sealing hole is about 1.2 mm, the wire diameter d of the second lead pin is about 0.21 mm, and the dielectric constant Er of the second sealing glass is about 4.4.

4. The package according to claim 1,
   wherein the stem body comprises
      a first surface, and
      a second surface opposite the first surface;
   wherein the first lead pin comprises another portion extending away from the second surface of the stem body;
   wherein the second lead pin comprises another portion extending away from the second surface of the stem body; and
   wherein the package further comprises a cap sealing at least the first surface of the stem body.

5. The package according to claim 1,
   wherein the wire diameter of the second lead pin is smaller than a wire diameter of the first lead pin.

6. The package according to claim 1,
   wherein the second sealing glass comprises mainly $SiO_2$.

* * * * *